(12) United States Patent
Shaffer et al.

(10) Patent No.: US 8,260,370 B2
(45) Date of Patent: Sep. 4, 2012

(54) METHOD AND APPARATUS FOR POWERING A WIRELESS PERIPHERAL

(75) Inventors: Don Shaffer, San Diego, CA (US); Kotaro Matsuo, Poway, CA (US)

(73) Assignee: KYOCERA Corporation, Kyoto (JP)

( * ) Notice: Subject to any disclaimer, the term of this patent is extended or adjusted under 35 U.S.C. 154(b) by 945 days.

(21) Appl. No.: 11/969,176

(22) Filed: Jan. 3, 2008

(65) Prior Publication Data
US 2010/0273536 A1 Oct. 28, 2010

(51) Int. Cl.
H04B 1/38 (2006.01)
(52) U.S. Cl. .................................... 455/572; 455/574
(58) Field of Classification Search .................. 455/573, 455/574, 522, 525, 343.1, 572; 330/69, 102
See application file for complete search history.

(56) References Cited

U.S. PATENT DOCUMENTS

| | | | |
|---|---|---|---|
| 4,989,260 A * | 1/1991 | Meade | 455/95 |
| 6,281,595 B1 * | 8/2001 | Sinha et al. | 290/40 A |
| 6,748,246 B1 * | 6/2004 | Khullar | 455/574 |
| 7,017,055 B1 | 3/2006 | Ho | |
| 7,047,040 B2 * | 5/2006 | Kim et al. | 455/557 |
| 2006/0135079 A1 * | 6/2006 | Barnett et al. | 455/69 |
| 2006/0183473 A1 * | 8/2006 | Ukon | 455/426.1 |
| 2006/0287007 A1 * | 12/2006 | Veselic et al. | 455/572 |
| 2007/0030857 A1 * | 2/2007 | Fulknier et al. | 370/401 |
| 2007/0178875 A1 * | 8/2007 | Rao et al. | 455/343.1 |
| 2008/0171568 A1 * | 7/2008 | Choi et al. | 455/522 |
| 2008/0186092 A1 * | 8/2008 | Camuffo et al. | 330/69 |

FOREIGN PATENT DOCUMENTS

| | | |
|---|---|---|
| EP | 1533682 | 5/2005 |
| EP | 1775652 | 4/2007 |

* cited by examiner

Primary Examiner — Edward Urban
Assistant Examiner — Golam Sorowar

(57) ABSTRACT

An apparatus for powering a wireless peripheral includes a controller and a power management circuit. The controller is configured to determine the strength of wireless signals received by the peripheral. The power management circuit selectively powers the peripheral with either an external power source or a combination of the external power source and an internal power source included in the wireless peripheral. If the wireless signal strength is weak, the power management circuit uses both the internal an external sources to power the peripheral. This allows the wireless peripheral to boost its transmit power, even though its power requirement may exceed that available from the external source. If the wireless signal strength is strong, the power management circuit uses only the external source to power the peripheral. When this occurs the internal power source may also be simultaneously charged by the external power source.

20 Claims, 3 Drawing Sheets

METHOD AND APPARATUS FOR POWERING A WIRELESS PERIPHERAL

TECHNICAL FIELD

The present invention relates to computer peripherals, and more particularly, to power management techniques for wireless peripherals.

BACKGROUND

Peripherals attach to computers and other electronic devices to add functionality. Wireless modems are an example of one type of peripheral. An external wireless modem can be connected to a computer or other device using a standard data bus, such as a Universal Serial Bus. A wireless modem allows a computer to wirelessly communicate with a communications system, such as a cellular system. During operation of the modem, the modem transmits and receives wireless signals to and from the communications system. In some instances, the communications system requests that the modem increase the transmit power of its signals. The modem can increase the transmit power up to a maximum transmit power.

Some peripherals, including some wireless modems, are powered by a power supply located in the device to which the modem is connected. However, it is frequently the case that these external power supplies are insufficient for the peripheral. For example, with a wireless modem, increasing the transmit power of the modem increases the current draw of the modem. As a result, the increased transmit power can cause the modem's current draw to exceed the maximum current available from the external power supply in the attached device.

To overcome this problem, some wireless modems include internal batteries to handle their extra power needs. However, in these modems, the internal battery must be separately charged, which typically requires an additional power adapter and cable. Other solutions, such as ganging host device ports connected to the peripheral to supply additional power, are not available in all circumstances.

Thus, there is a need for a wireless peripheral that offers a more elegant solution the power limitations often faced by peripheral devices.

SUMMARY

In accordance with an exemplary embodiment of the invention, an apparatus for powering a wireless peripheral includes a controller and a power management circuit. The controller is configured to determine the strength of wireless signals received by the peripheral. The power management circuit selectively powers the peripheral with either an external power source or a combination of the external power source and an internal power source included in the wireless peripheral. If the wireless signal strength is weak, the power management circuit uses both the internal an external sources to power the peripheral. This allows the wireless peripheral to boost its transmit power, even though its power requirement may exceed that available from the external source. If the wireless signal strength is strong, the power management circuit uses only the external source to power the peripheral. When this occurs the internal power source may also be simultaneously charged by the external power source.

Other aspects, features, advantages of the invention will be or will become apparent to one with skill in the art upon examination of the following figures and detailed description. It is intended that all such additional aspects, features, and advantages be included within this description and be protected by the accompanying claims.

BRIEF DESCRIPTION OF THE DRAWINGS

It is to be understood that the drawings are solely for purpose of illustration and do not define the limits of the invention. Furthermore, the components in the figures are not necessarily to scale. In the figures, like reference numerals designate corresponding parts throughout the different views.

DETAILED DESCRIPTION

The following detailed description, which references to and incorporates the drawings, describes and illustrates one or more specific embodiments of the invention. These embodiments, offered not to limit but only to exemplify and teach the invention, are shown and described in sufficient detail to enable those skilled in the art to practice the invention. Thus, where appropriate to avoid obscuring the invention, the description may omit certain information known to those of skill in the art.

Figure 1:
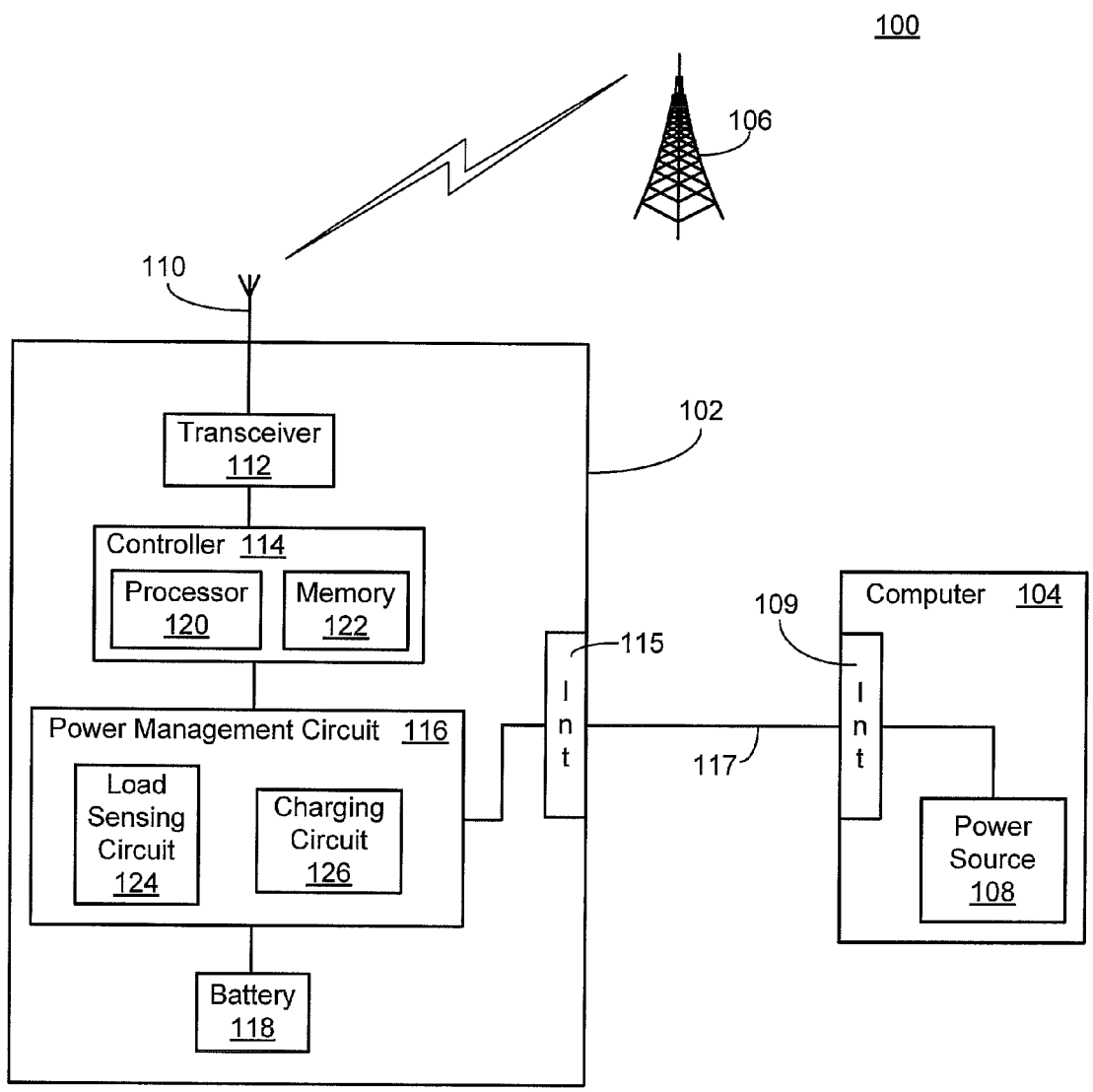
FIG. 1 illustrates an exemplary computer system configured to transmit and receive wireless signals in a communications system. The computer system includes a wireless modem connected to a computer such that the computer provides power to the modem.

FIG. 1 illustrates a computer 104 in wireless communication with a base station 106 of a wireless communications system 100. To effect wireless communications, the computer 104 is attached to a wireless modem peripheral 102 by way of a wired data bus 117.

The modem 102 enables the computer 104 to wirelessly communicate through the wireless communications system 100 over a wireless air-link. Examples of suitable wireless communications systems 100 include, but are not limited to, code-division multiple access (CDMA) based networks.

The modem 102 is configured to be detachably connected to the computer 104. When the modem 102 is connected to the computer 104, a power source 108 in the computer 104 provides power to the modem 102 (supplied power) by way of the data bus 117. The externally supplied power powers the operation of electronics in the modem 102. The electronics employ the supplied power to transmit wireless signals in the communications system 100. The modem 102 can vary the transmit power of the signals up to a maximum transmit power. Increasing the transmit power draws more current from the power source 108.

The modem includes at least one antenna 110, an air interface with radio frequency (RF) transceiver 114 having a transmitter (not shown) and a receiver (not shown), a controller 114, a power management circuit 116, a bus interface (Int) 115, and an internal power source such as a battery 118.

The bus interface 115 permits the wireless modem 102 to communicate with and receive power from the computer 104. It also allows the wireless modem 102 to be detachably connected to the computer 104. The computer 104 includes a corresponding bus interface (Int) 109 having port or a slot configured to detachably receive the data bus 117. Suitable bus interfaces include, but are not limited to, the Universal Serial Bus (UBS), Personal Computer Memory Card International Association (PCMCIA cards or PC cards), Express Cards, Miniature Cards (Mini Cards), and Express Mini Cards or Mini Express Cards.

The controller 114 includes a processor 120 and a memory 122. A suitable processor 120 may include, but is not limited to, a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions attributed to the controller 114, bus interface 115, processor 120 and/or power management circuit 116. A general purpose processor may be a microprocessor, but in the alternative, the processor may be any conventional processor, controller, microcontroller, or state machine. The processor 120 may also be implemented as a combination of computing devices, e.g., a combination of a DSP and a microprocessor, a plurality of microprocessors, one or more microprocessors in conjunction with a DSP core, or any other such configuration.

The memory 122 is in communication with the processor 120. The memory 122 can store data for communicating with the communications system 100 and computer 104. For instance, signal strength and current thresholds can be stored in the memory 122. The memory 38 can be any memory device or combination of memory devices suitable for read/write operations. The memory 122 can also store an operating system and one or more firmware/software programs having instructions to be executed by the processor 120 to carry out the operational functions of the wireless modem 102.

The transceiver 112 and controller 114 are preferably implemented using an off-the-shelf mobile station modem (MSM) chipset.

The power management circuit 116 includes a load sensing circuit 124 and a charging circuit 126. The power management circuit 116 may be any suitable combination of hardware and/or software components for supplying power to the modem 102. Preferably, the power management circuit 116 is a commercially-available power management IC (integrated circuit) having a digital communications interface for communicating with the controller 114. The power management circuit 116 is configured to selectively supply power from the modem battery 118, an external source such as the computer power source 108, or a combination of the battery 118 and the power source 108 at the direction of the controller 114. The power management circuit 116 is connectable to the computer power source 108 through the bus interface 115.

The load sensing circuit 124 includes an ammeter or its equivalent for monitoring the amount current being supplied to the modem 102 by power management circuit 116. The load sensing circuit 124 is configured to present modem current readings to the controller 114 upon receiving a request signal from the controller 114 to do so. The load sensing circuit 124 may include any suitable combination of hardware and/or software components for providing the above functions.

The charging circuit 126 includes a battery charger circuit and circuitry for activating and deactivating the battery charger circuit upon request from the controller 114. The battery charger circuit receives input power from the computer power source 108 through the bus interface 115 when the modem is connected to the computer 104. It then selectively supplies power to the modem battery 118 to recharge it during certain operational states of the modem 102, for example, as discussed below in connection with FIG. 2. Alternatively or additionally, the battery charger circuit can include a connector for connecting to separate input power supply source, such as an AC wall adapter. Suitable charging circuits are well known by those of ordinary skill in the art.

The battery 118 is a rechargeable battery, such as NiMH, Lithium-ion, NiCad battery, lead acid or the like.

The computer 104 includes, among other things, a wired bus interface 109 for communicating with the modem 102 and a power source 108, such as a power supply or battery. The power source 108 is external to the wireless modem 102. If the power source 108 is a battery, it can be a rechargeable battery, such as NiMH, Lithium-ion, NiCad battery, lead acid or the like. The computer 104 can be any suitable computing device, including a laptop computer, notebook computer, but can also be another type of computer, such as a desktop, game system, office equipment, home appliance or the like.

The power source 108 is an external power source that provides power to electronics in the wireless modem 102 through the data bus 117. For instance, wireless modem 102 may operate at about 5 V or 3.3 V. In some instances, the power source 108 provides power to the wireless modem 102 at about 5 V or at about 3.3 V.

The transceiver 112 is in communication with the antenna 110. The controller 114 is in communication with the transceiver 112. The controller 114 can employ the transceiver 112 to wirelessly transmit signals to the communications system 100 and to wirelessly receive signals from the communications system 100.

During operation of the modem 102, the modem 102 communicates with the communications system 100. Communication with the communications system 100 can include the modem 102 transmitting signals to the communications system 100 and receiving signals from the communications system 100. During communication with the communications system 100, the communications system 100 may determine that the signals transmitted by the modem 102 are undesirably weak. In response, the communications system 100 sends the modem 102 a signal requesting that the modem 102 increase the transmit power for the signals transmitted from the modem 102. The transmit power is the signal power at the output of the antenna 110 and is typically measured in units such as dBm or watts.

Figure 2:
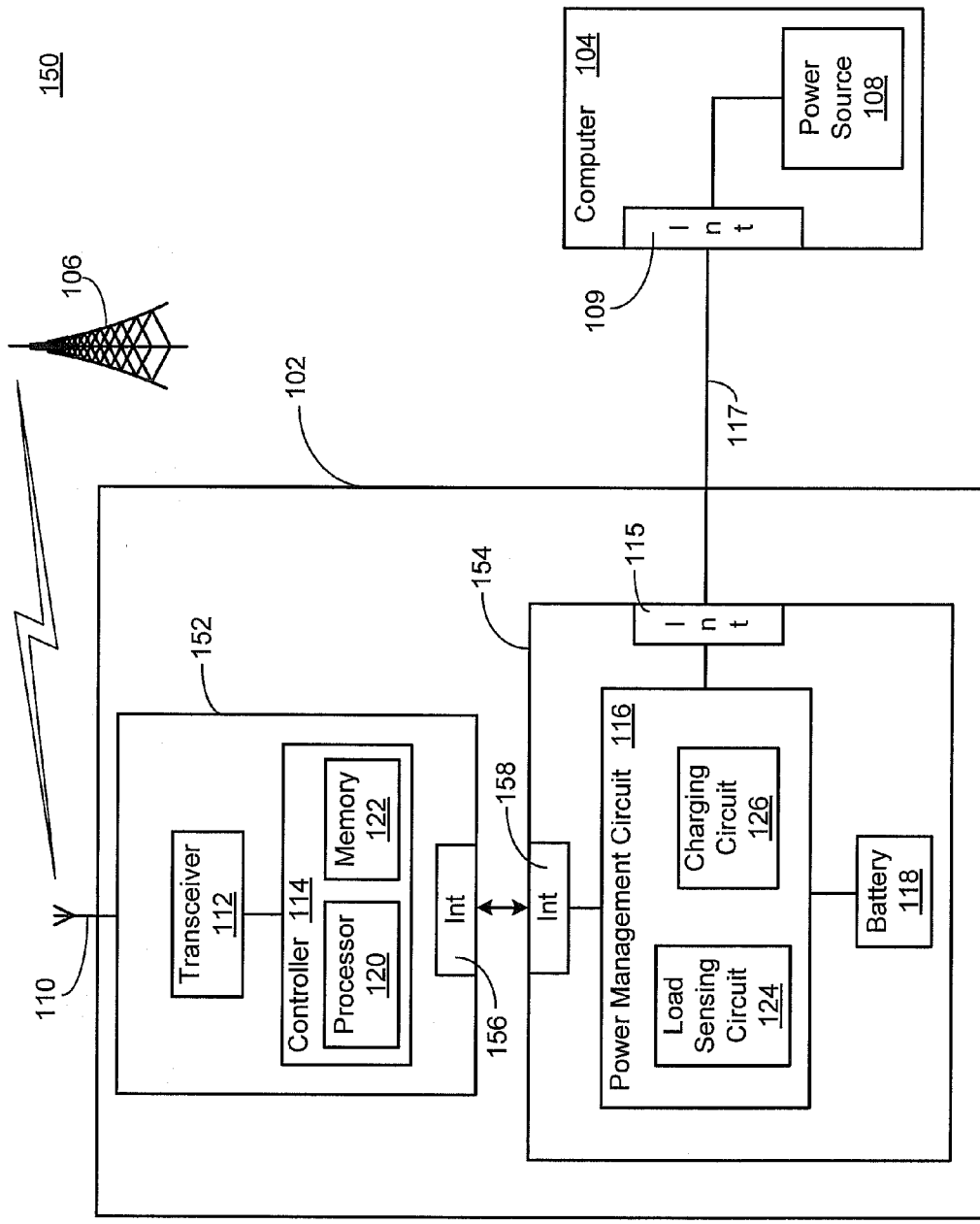
FIG. 2 illustrates another exemplary computer system configured to transmit and receive wireless signals in a communications system. The computer system includes a wireless modem having an alternative architecture to the wireless modem of FIG. 1.

FIG. 2 illustrates another exemplary communication system 150 that includes a wireless modem 102 having an alternative internal architecture to that illustrated in FIG. 1. In this modem architecture, the wireless modem 102 is a peripheral that includes a wireless modem card 152 that is detachably connected to an adapter 154. The adapter 154 is detachably connected to the computer 104 using data bus 117. In this configuration, the computer power source 108 supplies power to the modem card 152 through the adapter 154.

The modem card 152 is preferably a PCI Express type card having CDMA wireless modem capabilities and additionally functionality as described herein. However, other suitable modem card configurations include, but are not limited to, Personal Computer Memory Card International Association (PCMCIA cards or PC cards) having wireless modem capabilities, Miniature Cards (Mini Cards) having wireless modem capabilities, and Express Mini Cards or Mini Express Cards having wireless modem capabilities.

The modem card 152 includes a connector interface (Int) 156 that permits the modem card 152 to be detachably connected to a connector interface (Int) 158 in the adapter 154. For instance, a PCI Express Card typically employs a 26-contact beam on blade connector. The adapter 154 can include a port or a slot configured to receive all or a portion of the modem card 152. The connector interface 158 can be positioned in the port or slot such that the connector on the modem card 152 is connectable with the connector on the adapter 154.

The adapter 154 is preferably an external peripheral that connects to the computer 104 using a USB port.

The controller 114 in the modem card 152 and the power management circuit 116 communication with each other using the USB lines included in the PCI Express bus.

Figure 3:
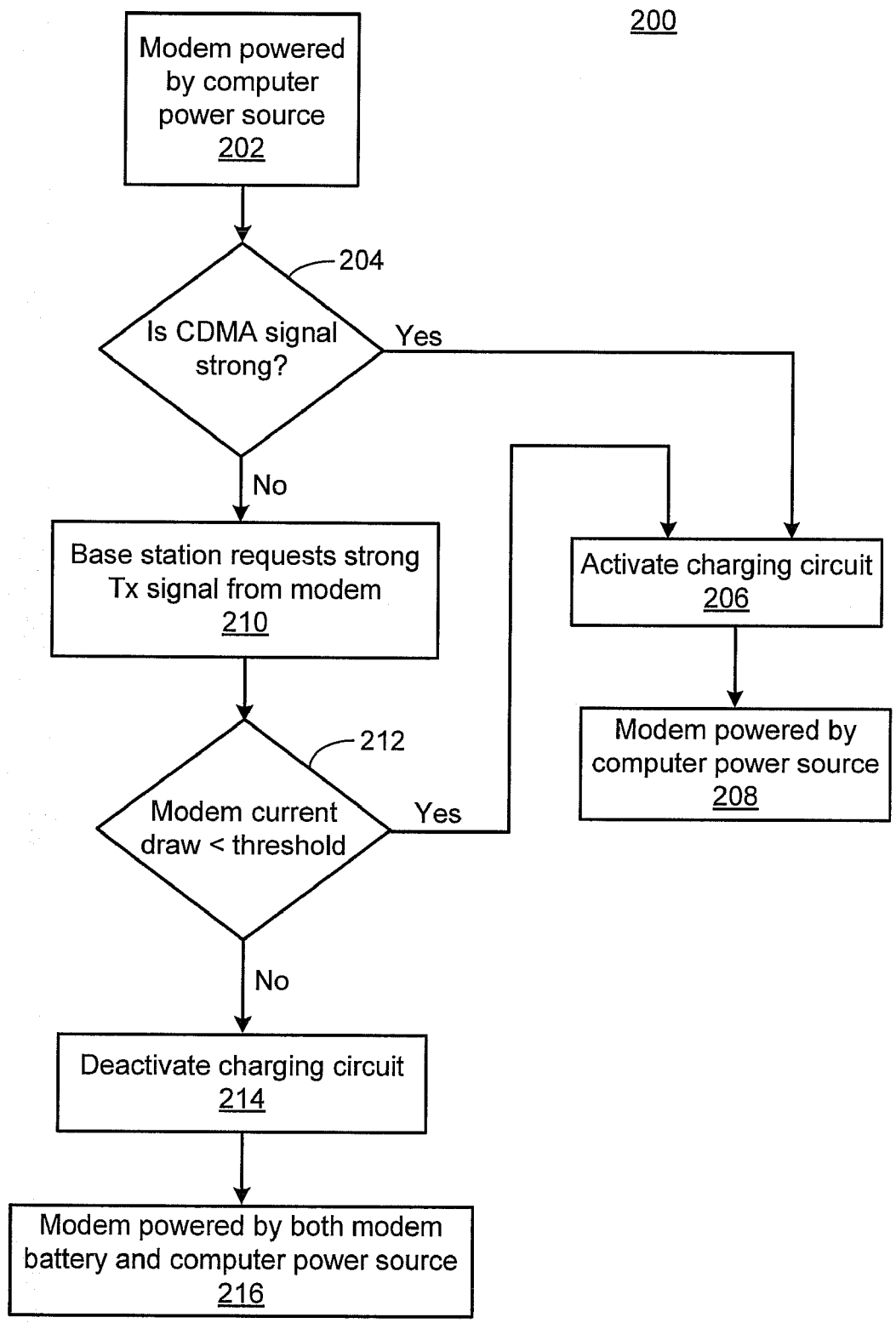
FIG. 3 is a flowchart illustrating a method of powering the wireless modems of FIGS. 1 and 2.

FIG. 3 is a flowchart 200 illustrating a method of powering the wireless modem 102. In step 202, the modem 102 is initially powered by the computer power supply 108 by way of the data bus 117. In this initial state, the modem's transmit power is set such that the power requirement of the modem 102 does not exceed that available from the computer power source 108.

In step 204, the controller 114 determines the strength of the CDMA signal. This can be done by monitoring the pilot signal emitted from the base station 106 using well known techniques. For example, the wireless modem 102 may perform a channel estimation by determining the strength of the pilot signal using a conventional network parameter, such as the carrier-to-interference ratio (C/I). Other techniques for determining signal strength may be used.

If the CDMA signal is above a predefined signal strength threshold, the controller 114 signals the power management circuit 116 to activate the charging circuit 126 to begin charging the modem battery 118, if necessary (step 206), using current drawn from the computer power source 108 over the data bus 117. The charging circuit 126 is configured to determine the charged state of the battery 118 and whether battery re-charging is necessary. In this state, the modem 102 is also supplied power by only the computer power source 108 (step 208) over the data bus 117.

If the CDMA signal is below the signal strength threshold, the modem 102 waits to receive a request from the base station 106 to increase the modem's transmit (Tx) power (step 212). The weak CDMA signal is typically the result of the modem 102 being located in a poor coverage area. With CDMA, the base station 106 can transmit the request over a control channel using known protocols and techniques.

Upon receiving the request for a stronger transmit signal, the controller 114 boosts the modem's transmit power and signals the load sensing circuit 124 to determine the modem's current draw. The modem's current draw varies directly with its transmit power: as the transmit power increase, so does the current required by the modem 102.

If the modem's current draw exceeds a predefined current threshold, the controller 114 deactivates the charging circuit 126 (step 214) and signals the power management circuit 116 to power the modem 102 using both the modem battery 118 and the computer power source 108 (step 216). To do this, the power management circuit 116 essentially connects the modem battery 118 in parallel with the power supply line(s) of the bus interface 115. The power management circuit 116 may include circuitry to ensure compatibility of the modem battery 118 and the computer power source 108, e.g., voltage leveler, reverse current protection, and the like.

The current threshold is set to a value that is not greater than the maximum current limit available from the computer power source 108 over the data bus 117. Preferably, the current threshold is slightly less than maximum output current of the data bus 117.

If the modem's current draw is below the current threshold, the controller 114 signals the power management circuit 116 to activate the charging circuit 126 to begin charging the modem battery 118, if necessary (step 206). The modem 102 is also supplied power by only the computer power source 108 (step 208).

All or a portion of the method described above can be executed by the modem electronics. In some instances, the electronics include a computer-readable medium and instructions for executing all or a portion of the methods disclosed above are included on the computer-readable medium. The processor 120 can execute these instructions during operation of the modem 102.

Other embodiments and modifications of this invention will occur readily to those of ordinary skill in the art in view of these teachings. The above description is illustrative and not restrictive. This invention is to be limited only by the following claims, which include all such embodiments and modifications when viewed in conjunction with the above specification and accompanying drawings. The scope of the invention should, therefore, be determined with reference to the appended claims along with their full scope of equivalents.

What is claimed is:

1. An apparatus, comprising:
a controller configured to determine a wireless signal strength;
a wired bus interface configured to connect to an external device having an external power source, the wired bus interface further configured to communicate with and receive power from the external device; and
a circuit configured to selectively power a wireless peripheral with either the external power source or a combination of the external power source and an internal power source included in the wireless peripheral, based on the wireless signal strength.

2. The apparatus of claim 1, further comprising a charging circuit configured to charge the internal power source when the wireless signal strength is above a predetermined signal strength threshold.

3. The apparatus of claim 2, further comprising means for deactivating the charging circuit when the wireless signal strength is below the predetermined signal strength threshold.

4. The apparatus of claim 1, wherein the wireless peripheral is a wireless modem.

5. The apparatus of claim 1, wherein the external power source is included in a computer connected to the wireless peripheral by way of a wired data bus.

6. The apparatus of claim 1, wherein the circuit powers the wireless peripheral using the external power source if the wireless signal strength is above a predetermined signal strength threshold, and the circuit powers the wireless peripheral using the combination of the external power source and internal power source if the wireless signal strength is below the predetermined signal strength threshold.

7. The apparatus of claim 1, further comprising a load sensing circuit configured to determine whether current drawn by the wireless peripheral exceeds a predetermined current threshold.

8. The apparatus of claim 7, wherein the controller is configured to boost transmit power of the wireless peripheral in response to receiving a request from a base station, and the load sensing circuit is configured to determine whether the current draw of the wireless peripheral operating at the boosted transmit power exceeds the predetermined current threshold, if so, the circuit powers the wireless peripheral with both the internal and external power sources.

9. A wireless peripheral, comprising:
a wireless interface configured to receive one or more wireless signals;

a controller configured to determine a strength of the wireless signals;

an internal power source;

a wired bus interface configured to connect to an external device having an external power source, the wired bus interface further configured to communicate with and receive power from the external device; and a circuit configured to selectively power the wireless peripheral using either the external power source or a combination of the external power source and the internal power source, based on the strength of the wireless signals.

10. The peripheral of claim 9, further comprising a charging circuit configured to charge the internal power source when the strength of the wireless signals is above a predetermined signal strength threshold.

11. The peripheral of claim 10, further comprising means for deactivating the charging circuit when the wireless signal strength is below the predetermined signal strength threshold.

12. The peripheral of claim 9, wherein the wired bus interface includes a USB port.

13. The peripheral of claim 9, wherein the wireless interface and the controller are included in a wireless modem card detachably connected to an adapter that includes the internal power source, the wired bus interface and the circuit.

14. The peripheral of claim 9, wherein the circuit powers the wireless peripheral using the external power source if the strength is above a predetermined signal strength threshold, and the circuit powers the wireless peripheral using the combination of the external power source and internal power source if the wireless signal strength is below the predetermined signal strength threshold.

15. The peripheral of claim 9, further comprising a load sensing circuit configured to determine whether current drawn by the wireless peripheral exceeds a predetermined current threshold.

16. The peripheral of claim 15, wherein the controller is configured to boost transmit power of the wireless peripheral in response to receiving a request from a base station, and the load sensing circuit is configured to determine whether the current draw of the wireless peripheral operating at the boosted transmit power exceeds the predetermined current threshold, if so, the circuit powers the wireless peripheral with the combination of the internal and external power sources.

17. A method of powering a wireless peripheral attachable to a device, comprising:

determining a wireless signal strength;

interfacing with the device via a wired bus interface, the wired bus interface configured to communicate with and receive power from the device; and powering the wireless peripheral with either an external power source included in the device or a combination of the external power source and an internal power source included in the wireless peripheral, based on the wireless signal strength.

18. The method of claim 17, further comprising:

charging the internal power source when the wireless signal strength is above a predetermined signal strength threshold.

19. The method of claim 17, wherein powering comprises:

powering the wireless peripheral using the external power source if the wireless signal strength is above a predetermined signal strength threshold; and powering the wireless peripheral using the combination of the external power source and the internal power source if the wireless signal strength is below the predetermined signal strength threshold.

20. The method of claim 17, further comprising:

boosting transmit power of the wireless peripheral in response to receiving a request from a base station;

determining whether the current draw of the wireless peripheral operating at the boosted transmit power exceeds a predetermined current threshold, if so, powering the wireless peripheral with the combination of the internal and external power sources, if not, powering the wireless peripheral with only the external power source.

* * * * *